United States Patent [19]

Wen

[11] Patent Number: 5,812,448

[45] Date of Patent: Sep. 22, 1998

[54] SEMICONDUCTOR READ-ONLY MEMORY DEVICE AND METHOD OF FABRICATING THE SAME

[75] Inventor: Jemmy Wen, Hsinchu, Taiwan

[73] Assignee: United Microelectronics Corp., Taiwan, China

[21] Appl. No.: 843,509

[22] Filed: Apr. 16, 1997

[30] Foreign Application Priority Data

Jan. 10, 1997 [TW] Taiwan ................................. 86100209

[51] Int. Cl.⁶ .................................................. G11C 11/34
[52] U.S. Cl. .......................... 365/182; 365/104; 257/296; 257/324; 257/326
[58] Field of Search .................... 365/182, 104; 257/296, 315, 324, 326

[56] References Cited

U.S. PATENT DOCUMENTS

| 4,057,821 | 11/1977 | Patel | 357/23 |
| 4,063,267 | 12/1977 | Hsia | 357/23 |
| 4,153,984 | 5/1979 | Hsia | 29/577 |
| 4,455,495 | 6/1984 | Masuhara et al. | 307/44 |
| 4,494,218 | 1/1985 | Naiff | 365/104 |
| 5,389,567 | 2/1995 | Acovic et al. | 437/52 |

*Primary Examiner*—David C. Nelms
*Assistant Examiner*—Hien Nguyen
*Attorney, Agent, or Firm*—Finnegan, Henderson, Farabow, Garrett & Dunner, L.L.P.

[57] ABSTRACT

A semiconductor read-only memory (ROM) device is provided. The particular semiconductor structure of this ROM device can reduce the parasitic capacitance between the bit lines and the word lines, such that the resistance-capacitance time constant of the memory cells can be reduced to thereby speed up the access time of the read operation to the memory cells. The binary data stored in each memory cell is dependent on whether one contact window is predefined to be formed in a thick insulating layer between the buried bit lines and the overlaying word lines. If the gate electrode of one memory cell is electrically connected to the associated word line via one contact window through the insulating layer, that memory cell is set to a permanently-ON state representing a first binary value; otherwise, that memory cell is set to a permanently-OFF state representing a second binary value.

6 Claims, 6 Drawing Sheets

SEMICONDUCTOR READ-ONLY MEMORY DEVICE AND METHOD OF FABRICATING THE SAME

BACKGROUND OF THE INVENTION

1. Field of the Invention

This invention relates to semiconductor memory devices, and more particularly, to a ROM (read-only memory) device of the type consisting of a plurality of MOS (metal-oxide semiconductor) transistor memory cells and a method for fabricating the same. It is a distinctive feature of this invention that a thick insulating layer is used to separate the bit lines from the word lines of the ROM device such that the parasitic capacitance therebetween the same can be reduced.

2. Description of Related Art

Read-only memory (ROM) is a nonvolatile semiconductor memory widely used in computer and microprocessor systems for permanently storing information including programs and data that are repeatedly used, such as the BIOS (abbreviation for Basic Input/Output System, a widely used operating system on personal computers) or the like. The manufacture of ROMs involves very complicated and time-consuming processes and requires costly equipment and material to achieve. Therefore, the information to be stored in ROMs is usually first defined by the customer and then furnished to the factory to be programmed into the ROMs.

The feature size of ROMs is dependent on the semiconductor fabrication technology. Conventional ROMs are formed by an array of MOSFETs (metal-oxide semiconductor field-effect transistor), each MOSFET being associated with one single memory cell of the ROM device. The binary state of each MOSFET is dependent on a particular electrical characteristic of the MOSFET, for example the threshold voltage of the MOSFET. If the channel of a MOSFET is doped with high-concentration impurities, the threshold voltage of this MOSFET will be reduced to a low level less than the gate voltage, thus setting the MOSFET to a permanently-ON state representing a first binary value, for example 0. On the other hand, if not doped with impurities, the threshold voltage will remain at a top level greater than the gate voltage, thus setting the MOSFET to a permanently-OFF state representing another binary value, for example 1. This conventional method for assigning binary data to the memory cells of a ROM device will be described in more detail in the following with reference to FIGS. 1 through 3.

Referring to FIG. 1, there is shown a schematic top view of a conventional ROM device. This ROM device is formed with a plurality of substantially parallel-spaced diffusion regions which serve as a plurality of buried bit lines 12a, 12b, 12c beneath a plurality of field oxide layers 200. Further, a plurality of word lines (WL1, WL2) 18, 18' are formed in such a manner as to intercross the bit lines 12a, 12b, 12c at right angles. The intersections between the bit lines 12a, 12b, 12c and the word lines WL1, WL2 are the locations where the memory cells of the ROM device are formed. For instance, a first memory cell 16a is formed on the word line WL2 between the bit lines 12a, 12b; a second memory cell 16b is formed on the word line WL2 between the bit lines 12b, 12c; a third memory cell 16c is formed on the word line WL1 between the bit lines 12a, 12b; and a fourth memory cell 16d is formed on the word line WL1 between the bit lines 12b, 12c. The binary data that are permanently stored in these memory cells 16a, 16b, 16c, 16d are dependent on the concentration of the associated diffusion regions. For instance, the N+ regions in FIG. 1 represent that the associated memory cells 16a, 16d are set to a permanently-ON state; and on the other hand, the memory cells 16b, 16c are set to an permanently-OFF state.

FIG. 2 is a perspective view of a cutaway part of the ROM device of FIG. 1, with the front side thereof showing a cross section cutting through the line II—II in FIG. 1 This perspective diagrams shows that the ROM device includes a P-type silicon substrate 10 on which the bit lines 12a, 12b, 12c and the overlaying field oxide layers 200 are formed. Beside these, the ROM device includes a thin insulating layer 14 on which the word lines (WL1, WL2) 18, 18' are formed.

FIG. 3 is an equivalent circuit diagram of the ROM device of FIG. 1. This circuit diagram shows that the two word lines WL1 and WL2 are used to access the binary data stored in the four memory cells 16a, 16b, 16c, 16d via the three bit lines (BL1, BL2, BL3) 12a, 12b, 12c. In this example, the first memory cell 16a is set to a permanently-ON state; the second memory cell 16b is set to a permanently-OFF state; the third memory cell 16c is set to a permanently-OFF state; and the fourth memory cell 16d is set to a permanently-ON state.

One drawback to the foregoing ROM device, however, is that, since the bit lines (BL1, BL2, BL3) 16a, 16b, 16c and the word lines (WL1, WL2) 18, 18' are only separated by the thin insulating layer 14, a parasitic capacitance could arise therebetween. The existence of the parasitic capacitance will increase the resistance-capacitance time constant of the memory cells, thus causing a delay in the access time to the memory cells.

SUMMARY OF THE INVENTION

It is therefore a primary objective of the present invention to provide a new semiconductor structure for a ROM device which can reduce the parasitic capacitance between the bit lines and the word lines for fasten access time of the ROM device.

It is another objective of the present invention to provide a method for fabricating the foregoing ROM device.

In accordance with the foregoing and other objectives of the present invention, a new semiconductor structure for ROM device and a method for fabricating the same are provided.

The semiconductor structure of this new ROM device is based a semiconductor substrate of a first type, for example P-type. A plurality of substantially parallel-spaced diffusion regions of a second type, for example N-type, are formed in the substrate to serve as a plurality of bit lines for the ROM device. Further, a plurality of gate dielectric layers are formed over the substrate, each functionally connecting each neighboring pair of the bit lines. An insulating layer is formed over the gate dielectric layer and the plurality of gate electrodes. A plurality of conductive layers are formed over the insulating layer in such a manner as to intercross the plurality of diffusion regions at right angles to serve as a plurality of word lines for the ROM device. The combination of each neighboring pair of the bit lines and the associated gate electrode forms one memory cell for the ROM device.

In the foregoing ROM device, if the gate electrode of one memory cell is electrically connected to the associated word line via a predefined contact window in the insulating layer, that memory cell is set to a permanently-ON state representing a first binary value. On the other hand, if the gate electrode of one memory cell is not electrically connected to the associated word line via a predefined contact window in the insulating layer, that memory cell is set to a permanently-OFF state representing a second binary value.

Further, the method in accordance with the invention for fabricating the foregoing ROM device includes the following steps:

(1) preparing a semiconductor substrate of a first type;

(2) forming a plurality of substantially parallel-spaced diffusion regions of a second type in the substrate, the plurality of diffusion regions serving as a plurality of bit lines for the ROM device;

(3) forming a gate dielectric layer and a first conductive layer successively over the substrate;

(4) performing a first photolithographic and etching process so as to remove selected parts of the first conductive layer to form a plurality of gate electrodes, wherein each of the gate electrodes functionally connecting each neighboring pair of bit lines, the combination of each neighboring pair of bit lines and the associated gate electrode forms one memory cell for the ROM device;

(5) forming an insulating layer over the gate dielectric layer and the plurality of gate electrodes;

(6) performing a second photolithographic and etching process so as to remove selected parts of the insulating layer to expose those gate electrodes that are associated with those memory cells that are to be set to a permanently-ON state, with the unexposed gate electrodes being associated with those memory cells that are to be set to a permanently-OFF state; and (7) forming a plurality of second conductive layers over the insulating layer, the second conductive layers being substantially parallel-spaced and intercrossing the plurality of diffusion regions to serve as a plurality of word lines for the ROM device.

It is a distinctive feature of the ROM device of the invention that a thick insulating layer is formed to separate the bit lines and the word lines. The ON-OFF state of each memory cell is dependent on whether a contact window is formed through the overlaying thick insulating layer to electrically connect the associated gate electrode of that memory cell to one word line. The provision of the thick insulating layer can reduce the parasitic capacitance between the bit lines and the word lines. As a result of this, the resistance-capacitance time constant of the memory cells can be reduced, thereby allowing a fasten access time of the ROM device for high-speed data read operation.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

FIGS. 4A through 4D are schematic sectional diagrams depicting the steps involved in the method according to the present invention for fabricating a ROM device.

Figure 1:
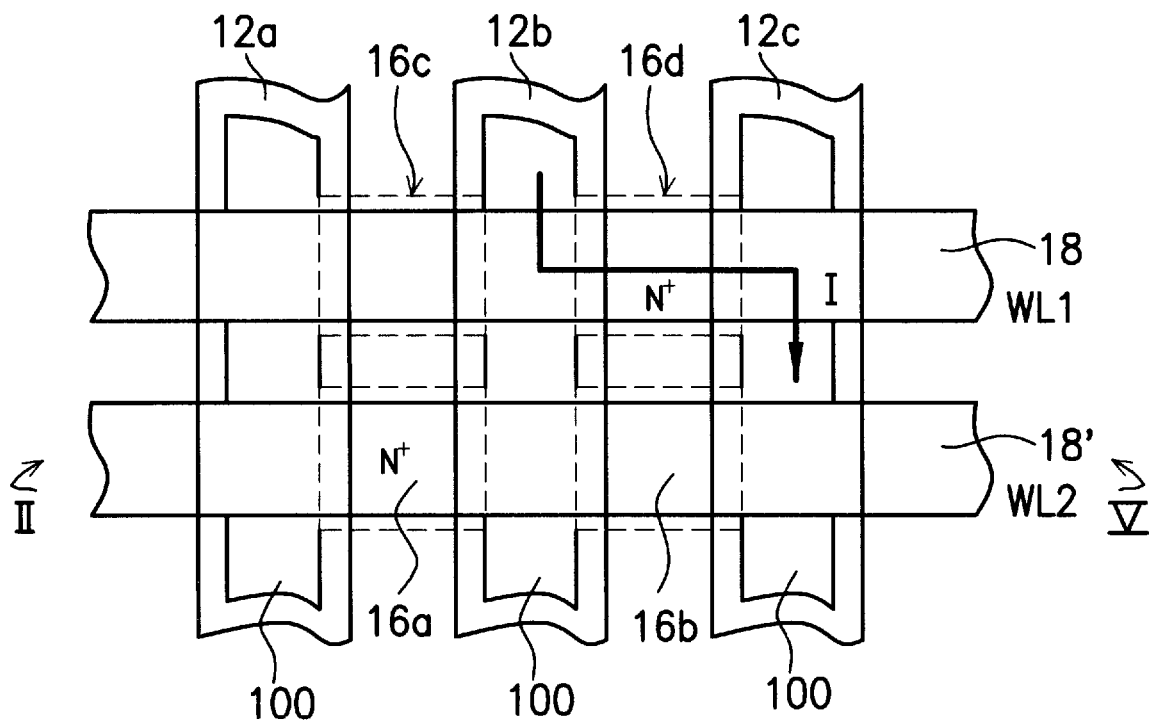
FIG. 1 is a schematic top view of a conventional ROM device.
Figure 2:
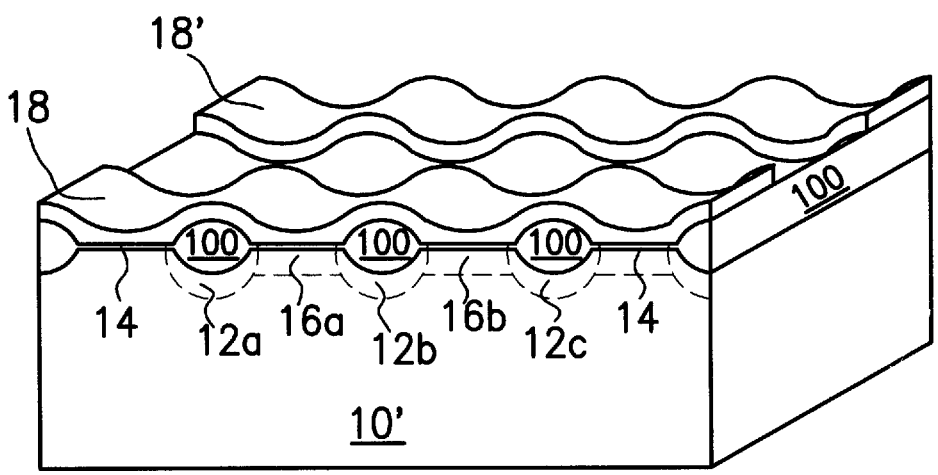
FIG. 2 is a schematic perspective view of a cutaway part of the ROM device of FIG. 1 cutting through the line II—II in FIG. 1.
Figure 3:
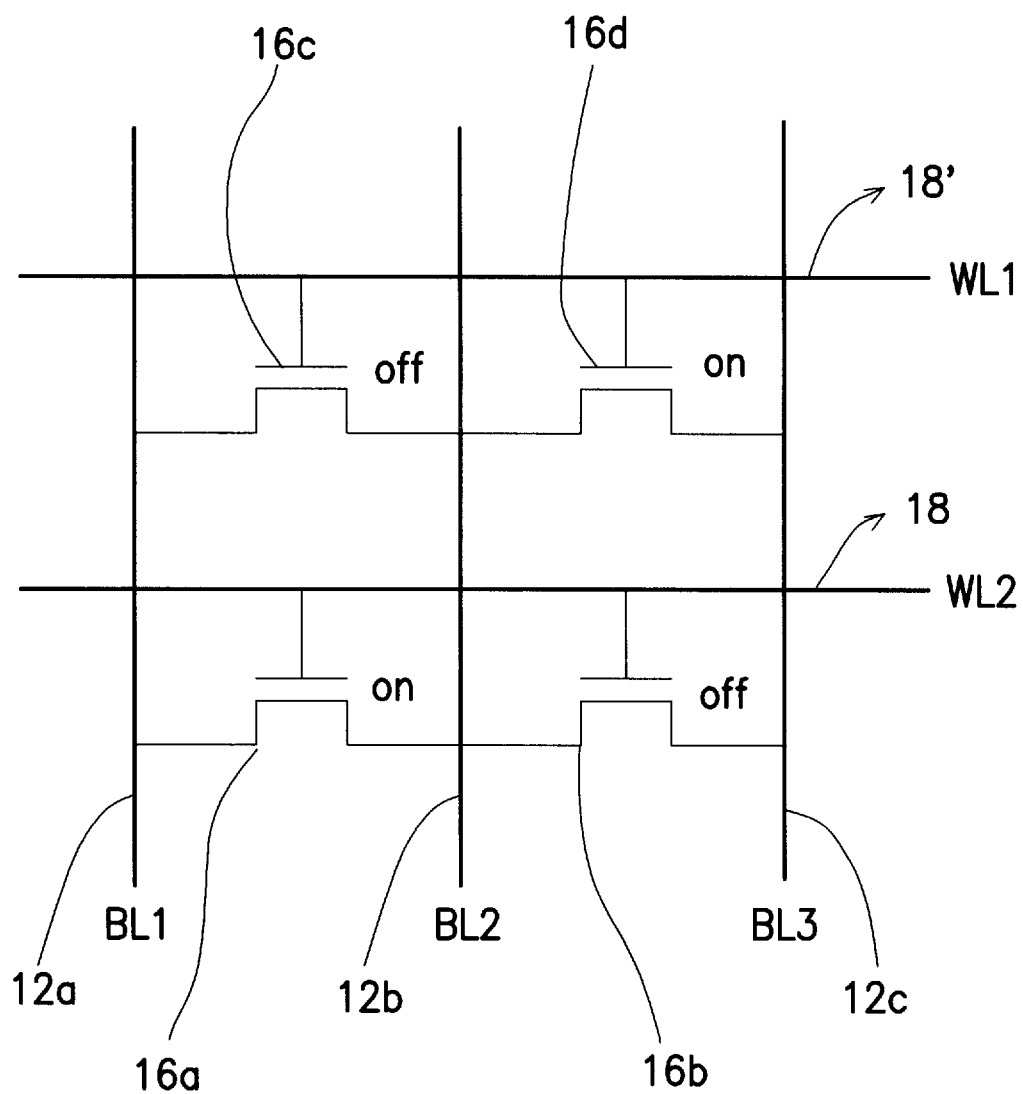
FIG. 3 is an equivalent circuit diagram of the ROM device of FIG. 1.
Figure 4A:
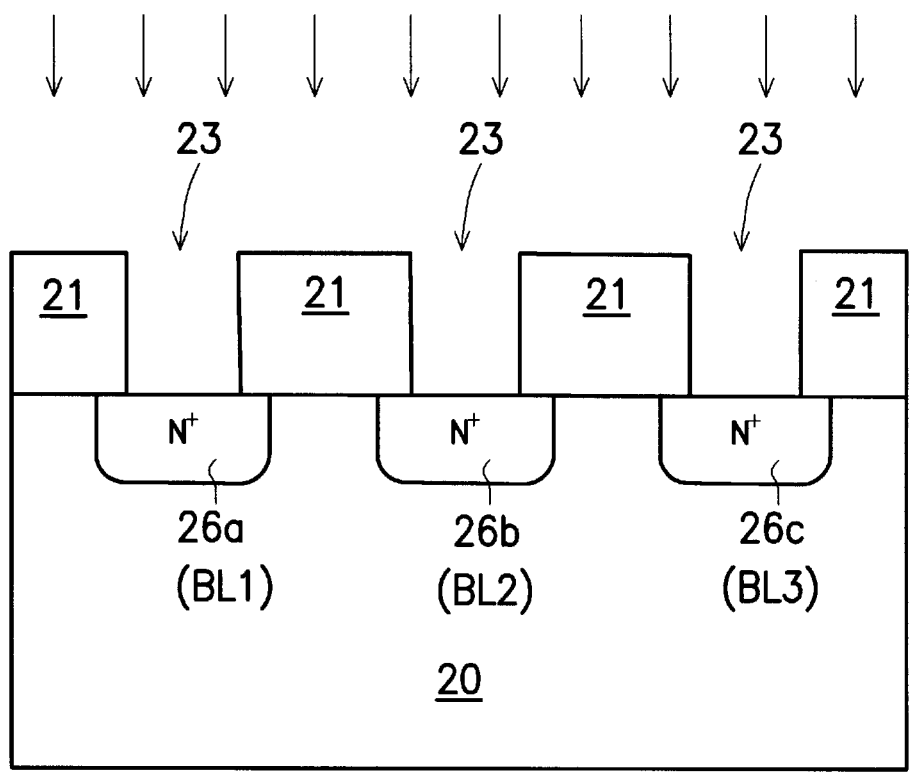
FIGS. 4A through 4D are schematic sectional diagrams used to depict the steps involved in the method according to the present invention for fabricating the ROM device of the invention.

Referring first to FIG. 4A, in the first step, a semiconductor substrate, such as a P-type silicon substrate 20, is prepared. Subsequently, a conventional photolithographic and etching process is performed to form a photoresist layer 21 having a plurality of predefined openings 23 located at those positions where the bit lines of the ROM device are to be formed. By using the photoresist layer 21 as a mask, an ion implantation process is then performed on the wafer so as to diffuse an N-type impurity material, such as arsenic or phosphorus ions, through the openings 23 in the photoresist layer 21 into the exposed regions of the P-type silicon substrate 20. As a result of this, a plurality of substantially parallel-spaced $N^+$ diffusion regions 26a, 26b, and 26c are formed, which serve as a plurality of bit lines BL1, BL2, BL3 for the ROM device.

Alternatively, the P-type silicon substrate 20 can be an N-type silicon substrate. If this is the case, a P-type impurity material should be used instead for the ion implantation process.

Figure 4B:
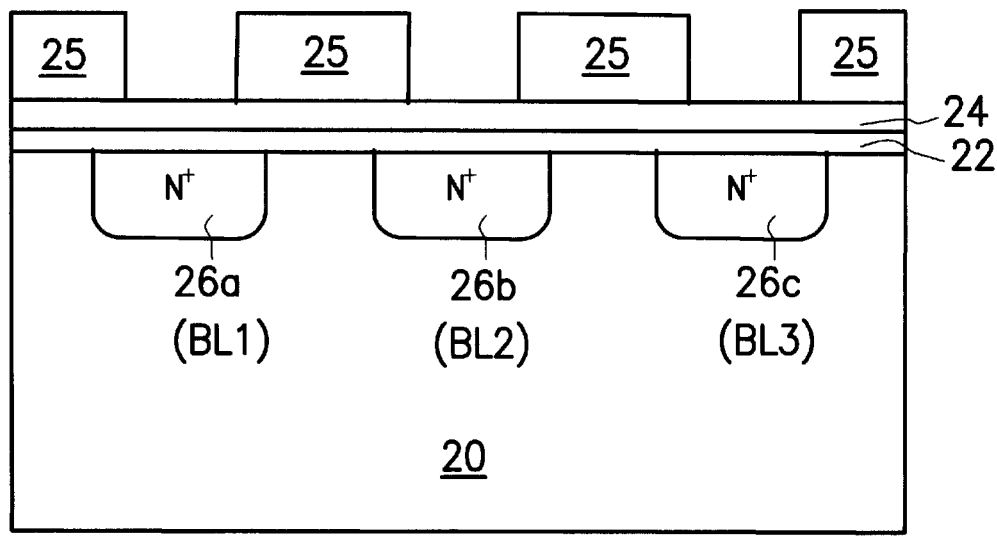

Referring next to FIG. 4B, in the subsequent step, the photoresist layer 21 is removed. Then, a thin insulating layer, such as a layer of silicon dioxide 22, is formed over the P-type silicon substrate 20. This silicon dioxide layer 22 will serve as a gate dielectric layer for the MOS-transistor memory cells of the ROM device. Next, a conductive layer, such as a polysilicon layer 24, is formed over the silicon dioxide layer 22. After that, a conventional photolithographic and etching process is performed on the wafer so as to form a photoresist layer 25 which is selectively removed to expose the areas under which the $N^+$ diffusion regions (bit lines BL1, BL2, BL3) 26a, 26b, and 26c are located.

Figure 4C:
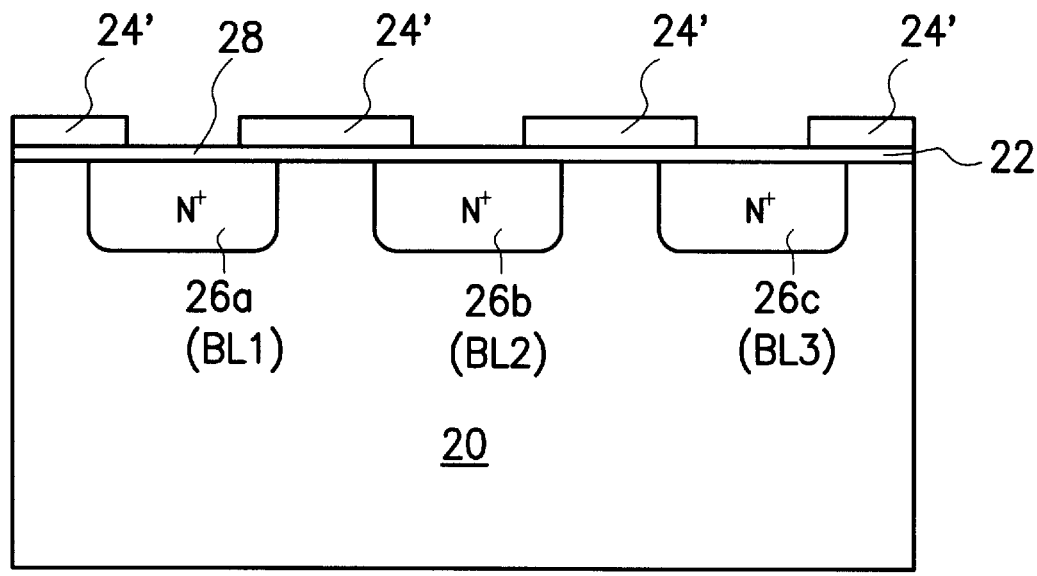

Referring further to FIG. 4C, in the subsequent step, an etching process using the photoresist layer 25 as a mask is performed on the wafer, so as to remove those parts of the polysilicon layer 24 that are uncovered by the photoresist layer 25. The remaining parts of the polysilicon layer 24 serve as gate electrodes for the MOS-transistor memory cells of the ROM device and will be hereinafter designated by the new reference numeral 24'. During this etching process, however, the silicon dioxide layer 22 is not etched.

Figure 4D:
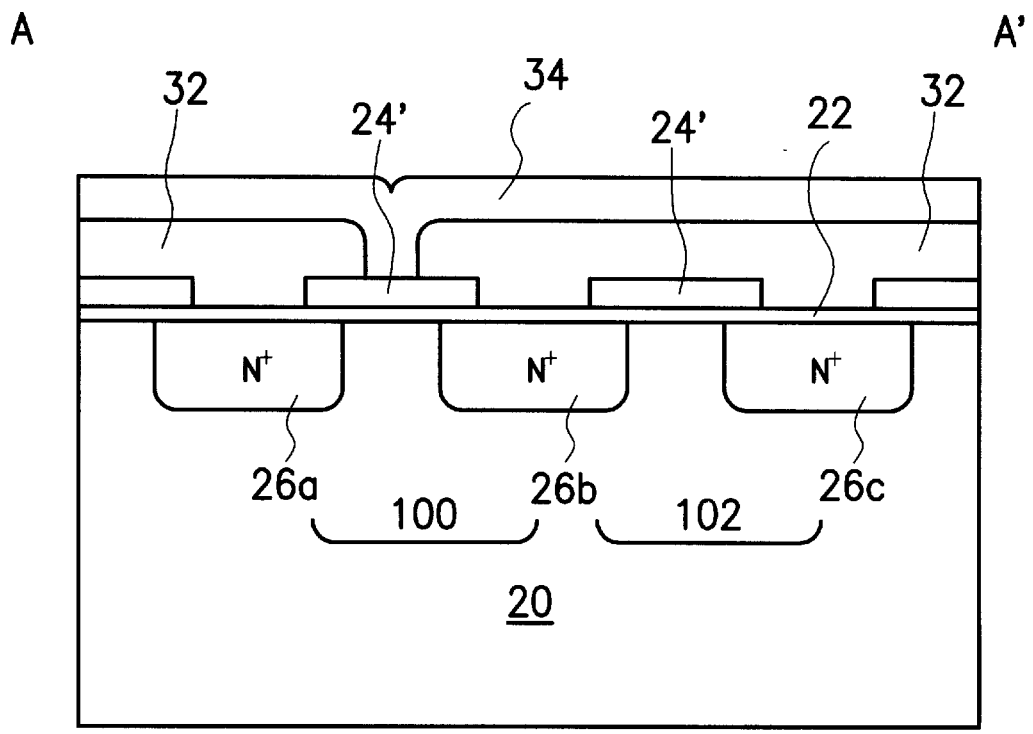
Figure 5:
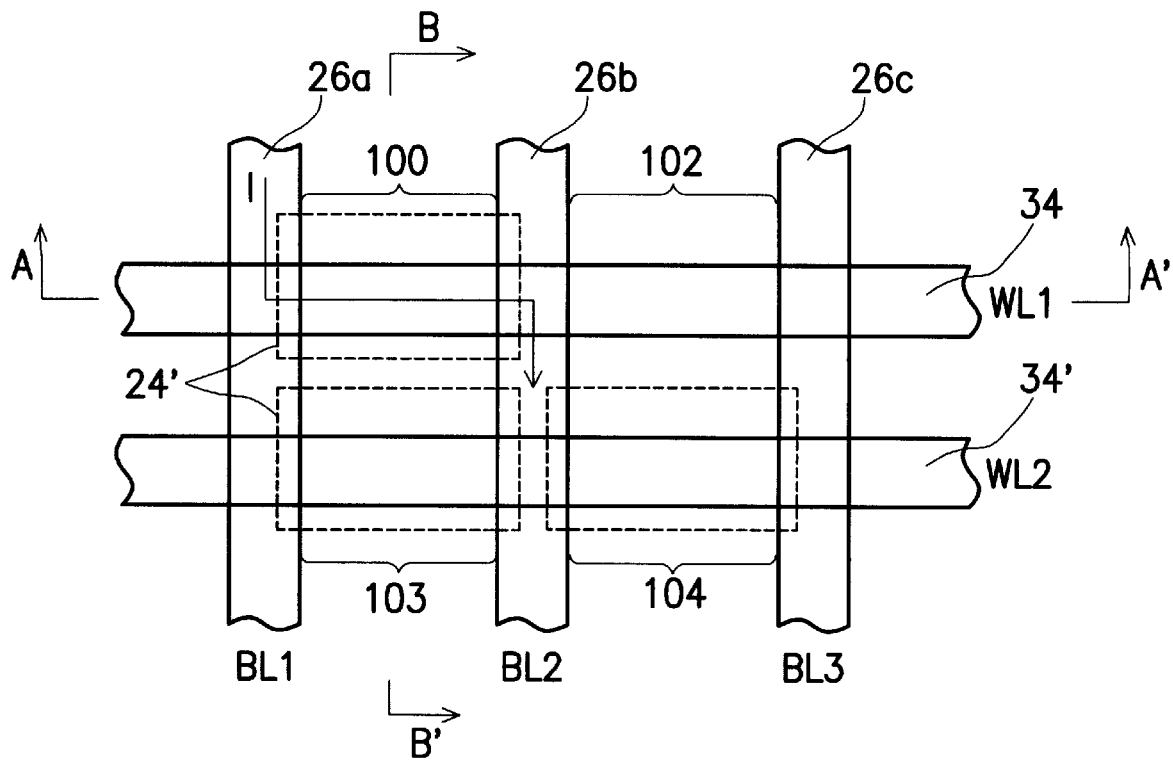
FIG. 5 is a schematic top view of the finished product of the ROM device shown in FIG. 4D.

Referring further to FIG. 4D, in the subsequent step, a thick insulating layer, such as a layer of silicon dioxide 32, is formed over the wafer to cover the polysilicon layers (gate electrode) 24' and the exposed areas of the silicon dioxide layer (gate dielectric layer) 22. The silicon dioxide layer 32 is predefined to form a contact window which exposes a selected one of the polysilicon layers (gate electrode) 24' that is located above the two $N^+$ diffusion regions 26a and 26b which are associated with one of the MOS-transistor memory cells of the ROM device that is to be set to a permanently-ON state. Subsequently, a plurality of substantially parallel-spaced conductive layers 34 of a conductive material selected from the group consisting of polysilicon, aluminum, tungsten, and titanium, are formed over the silicon dioxide layer 32 (only one of these conductive layers is visible and shown in the sectional view of FIG. 4D, but FIG. 5 shows two word lines WL1, WL2 formed by two such conductive layers 34, 34') to serve as a plurality of word lines intercrossing the bit lines BL1, BL2, BL3 (the N+ diffusion regions 26a, 26b, and 26c). These N+ diffusion regions 26a, 26b, and 26c serve as source/drain regions for the MOS-transistor memory cells of the ROM device.

The two N+ diffusion regions (bit lines BL1, BL2) 26a and 26b and the associated one of the polysilicon layers (gate electrode) 24' in combination form one MOS-transistor memory cell for the ROM device, as collectively designated by the reference numeral 100 in FIG. 4D. In this MOS-transistor memory cell 100, the associated one of the polysilicon layers (gate electrode) 24' that is located above the two N+ diffusion regions (bit lines BL1, BL2) 26a and 26b is electrically connected to the overlaying conductive layer (word line) 34 via the predefined contact window in the silicon dioxide layer 32. As a result of this, the MOS-transistor memory cell 100 is set to a permanently-ON state with a threshold voltage of about 0.7 V (volt).

On the other hand, the two N+ diffusion regions (bit lines BL2, BL3) 26b and 26c and the associated one of the polysilicon layers (gate electrode) 24' in combination form another one MOS-transistor memory cell for the ROM device, as collectively designated by the reference numeral 102 in FIG. 4D. In this MOS-transistor memory cell 102, the associated one of the photoresist layers (gate electrode) 24' that is located above the two N+ diffusion regions (bit lines BL2, BL3) 26b and 26c is entirely covered by the silicon dioxide layer 32 with no connection to the overlaying conductive layer (word line) 34. As a result of this, the MOS-transistor memory cell 102 is set to a permanently-OFF state.

FIG. 5 shows a schematic top view of the finished product of the ROM device of FIG. 4D. In FIG. 5, the cross-sectional view cutting through the line A–A' is the one shown in FIG. 4D. The intersections between the bit lines BL1, BL2, BL3 (the N+ diffusion regions 26a, 26b, and 26c) and the word lines WL1, WL2 (the conductive layers 34, 34') are the locations where the memory cells of the ROM device are formed. For instance, a first memory cell 100 is formed on the word line WL1 between the bit lines BL1, BL2; a second memory cell 102 is formed on the word line WL1 between the bit lines BL2, BL3; a third memory cell 103 is formed on the word line WL2 between the bit lines BL1, BL2; and a fourth memory cell 104 is formed on the word line WL2 between the bit lines BL2, BL3.

If the polysilicon layer (gate electrode) 24' in one memory cell, for example the memory cell 100, is connected via a predefined contact window in the silicon dioxide layer 32 to the overlaying word line, that memory cell is set to a permanently-ON state; otherwise, if the polysilicon layer (gate electrode) 24' in one memory cell, for example the memory cell 102, is entirely covered by the silicon dioxide layer 32 with no connection to the overlaying word line, that memory cell is set to a permanently-OFF state.

Figure 6:
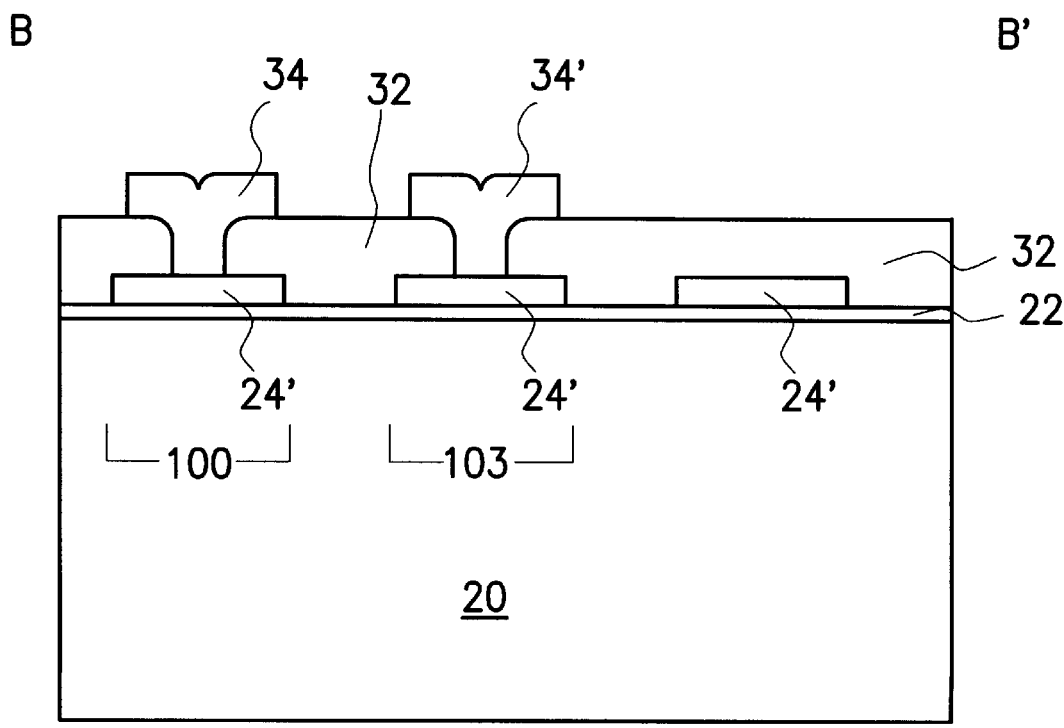
FIG. 6 is a schematic sectional diagram of the ROM device of FIG. 5 cutting through the line B–B'.

FIG. 6 shows another cross-sectional view of the ROM device of FIG. 5 cutting through the line B–B'. In particular, this diagram shows the two memory cells 100 and 103 which are set to a permanently-ON state by connecting the respective polysilicon layers (gate electrodes) 24' via a contact window in the silicon dioxide layer 32 to the overlaying conductive layers 34 and 34' (word lines WL1 and WL2).

Figure 7:
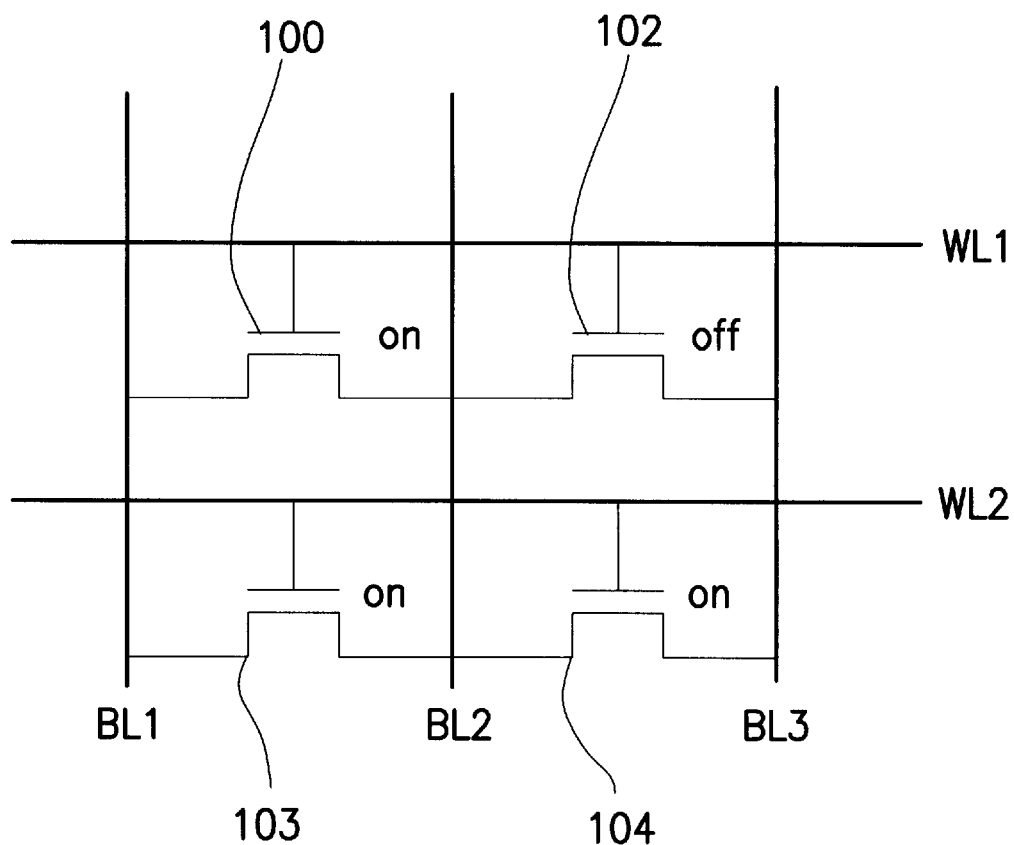
FIG. 7 is an equivalent circuit diagram of the ROM device of FIG. 5.

FIG. 7 is an equivalent circuit diagram of the ROM device of FIG. 5. This circuit diagram shows that the two word lines WL1 and WL2 are used to access the binary data stored in the four memory cells 100, 102, 103, 104 via the three bit lines BL1, BL2, BL3. In this example, the first memory cell 100 is set to a permanently-ON state; the second memory cell 102 is set to a permanently-OFF state; the third memory cell 103 is set to a permanently-ON state; and the fourth memory cell 104 is set to a permanently-ON state.

The threshold voltage of the above-disclosed MOS-transistor memory cells of the ROM device is about 0.7 V. It is a distinctive feature of the ROM device of the invention that a thick insulating layer is used to separate the bit lines and the word lines. The ON-OFF state of each memory cell is dependent on whether a contact window is formed through the thick insulating layer to electrically connect the associated gate electrode of that memory cell to one word line. The provision of the thick insulating layer can reduce the parasitic capacitance between the bit lines and the word lines. As a result of this, the resistance-capacitance time constant of the memory cells can be reduced, thereby allowing a fasten access time of the ROM device for high-speed data read operation.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A ROM device of the type having a plurality of MOS-transistor memory cells, comprising:

a semiconductor substrate of a first type;

a plurality of substantially parallel-spaced diffusion regions of a second type formed in said substrate, said plurality of diffusion regions serving as a plurality of buried bit lines;

a gate dielectric layer formed over said substrate;

a plurality of gate electrodes, each functionally connecting each neighboring pair of said bit lines;

an insulating layer covering said gate dielectric layer and said plurality of gate electrodes; and a plurality of substantially parallel-spaced conductive layers formed over said insulating layer and intercrossing said plurality of diffusion regions, said plurality of conductive layers serving as a plurality of word lines;

wherein the combination of each neighboring pair of said bit lines and the associated gate electrode forms one memory cell for said ROM device.

2. The ROM device of claim 1, wherein said first type is P-type while said second type is N-type.

3. The ROM device of claim 1, wherein said first type is N-type while said second type is P-type.

4. The ROM device of claim 1, wherein said gate electrode is formed by an electrically conductive material.

5. The ROM device of claim 1, wherein each one of said plurality of memory cells is set to a permanently-ON state provided that the associated pair of bit lines are connected via said contact window to one word line.

6. The ROM device of claim 1, wherein each one of said plurality of memory cells is set to a permanently-OFF state provided that the associated pair of bit lines are not connected via said contact window to one word line.

* * * * *